United States Patent

Kuster et al.

[11] Patent Number: 6,112,885
[45] Date of Patent: Sep. 5, 2000

[54] TRANSPORT APPARATUS FOR THIN, BOARD-SHAPED SUBSTRATES

[75] Inventors: Kaspar Kuster, Therwil; Anton Rüegge, Allschwil, both of Switzerland; Gerhard Kraft, Kandern-Wollbach, Germany; Torsten Reckert, Glendale, Calif.

[73] Assignee: Ciba Specialty Chemicals Corp., Tarrytown, N.Y.

[21] Appl. No.: 09/035,310

[22] Filed: Mar. 5, 1998

[30] Foreign Application Priority Data

Mar. 5, 1997 [EP] European Pat. Off. ............. 97103632

[51] Int. Cl.⁷ .................................................... B65G 29/00
[52] U.S. Cl. .................. 198/867.06; 198/465.3; 198/800; 198/867.14
[58] Field of Search ..................................... 198/793, 797, 198/800, 867.01, 867.02, 867.05, 867.06, 867.14, 867.15, 465.3, 468.3, 468.9, 470.1, 475.1; 228/43

[56] References Cited

U.S. PATENT DOCUMENTS

| | | | |
|---|---|---|---|
| 3,938,847 | 2/1976 | Peyton | 198/468.3 X |
| 4,540,084 | 9/1985 | Curti | 198/468.3 X |
| 4,588,070 | 5/1986 | Smith | 198/468.3 X |
| 4,759,488 | 7/1988 | Robinson et al. | 228/43 |

FOREIGN PATENT DOCUMENTS 0508977  10/1992  European Pat. Off. .

OTHER PUBLICATIONS

Derwent Abst. 92–342227 [42] for EP 0508977.

*Primary Examiner*—Christopher P. Ellis
*Assistant Examiner*—Gene O. Crawford
*Attorney, Agent, or Firm*—David R. Crichton; Michele A. Kovaleski

[57] ABSTRACT

The present invention is directed to a transport apparatus for thin, board-shaped substrates, for example printed circuit boards, which are conveyed through a coating installation and the like. In order to simplify manipulation during conveying, there is provided a frame (1) for holding a substrate (7), tensioning elements (4) being arranged spaced from one another on frame members (2), lying opposite one another, of the frame (1), which tensioning elements (4) engage the edge of the substrate and tension the substrate, the frame (1) being provided with a device (16) which serves to provide connection to a conveyor belt or the like. The tension springs (4) exert a tension away from the substrate (7) in the direction of the plane of the thin substrate to avoid sagging of the substrate. FIG. (1) illustrates the transport apparatus.

8 Claims, 5 Drawing Sheets

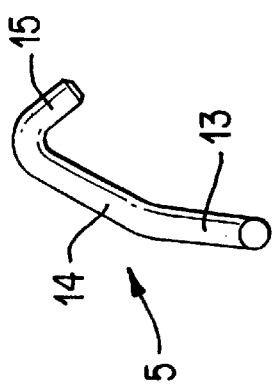
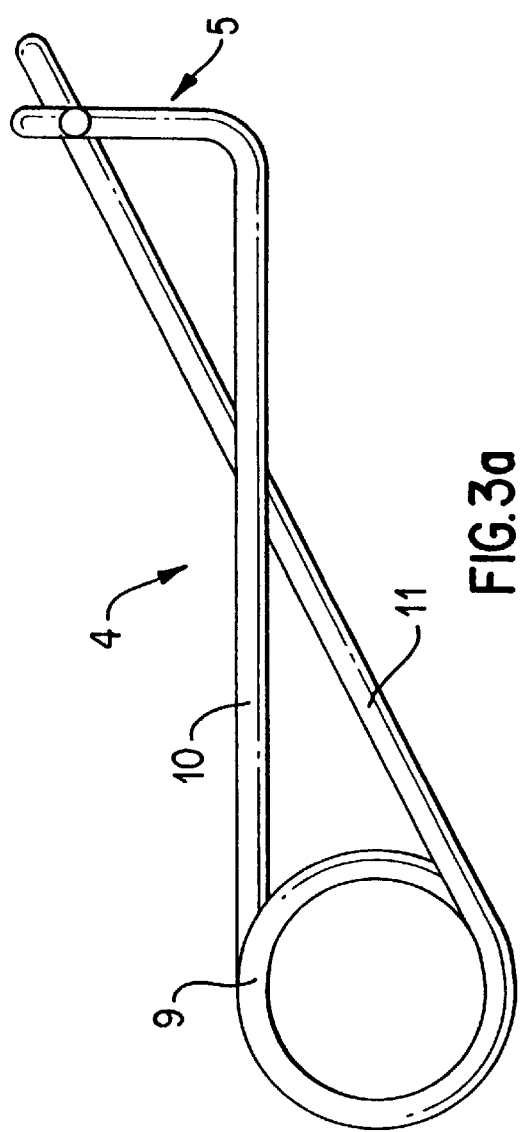
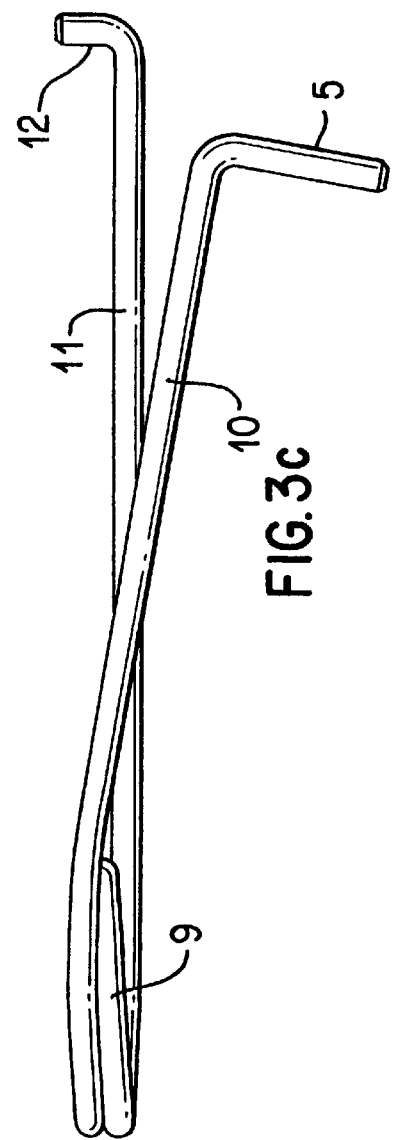

TRANSPORT APPARATUS FOR THIN, BOARD-SHAPED SUBSTRATES

The invention relates to a transport apparatus for thin, board-shaped substrates, for example printed circuit boards, which are conveyed through a coating installation, a solder mask and the like.

During the manufacturing process, thin, board-shaped substrates, such as printed circuit boards, must be conveyed through various treatment and processing stations, for example through solder masks, coating stations and the like, the thin substrates being subjected to various thermal processes and transport being very difficult owing to the thinness of the material. If conveyor belts or roller conveyors are used, a printed circuit board must often be transferred from one conveyor to the next, for example when such a thin board is to be coated on both sides.

The problem underlying the invention is so to develop a transport apparatus of the type described at the outset that the thin, board-shaped substrates can be transported through various processing and treatment zones without complicated manipulation of the thin substrates being required during the transport.

The problem is solved according to the invention by the features of claim 1. As a result of the fact that the thin, board-shaped substrates are each mounted in a suspended manner in a frame, they can be conveyed through various treatment and processing stations by means of that frame without a transfer or the like being required. If the board is to be coated on both sides, all that is required is for the frame to be turned without the board itself having to be manipulated by a turning device or the like.

A further advantage of the mounting of a board-shaped substrate in a frame is that, independently of the type of processing operation, no distinction needs to be made between the processing of a thick board and that of a thin board. Adaptations to an existing production line can therefore be reduced to a minimum.

The invention is described in greater detail by way of an example with reference to drawings, in which:

FIGS. 3a to 3c are different views of a tension spring; and

Figure 1:
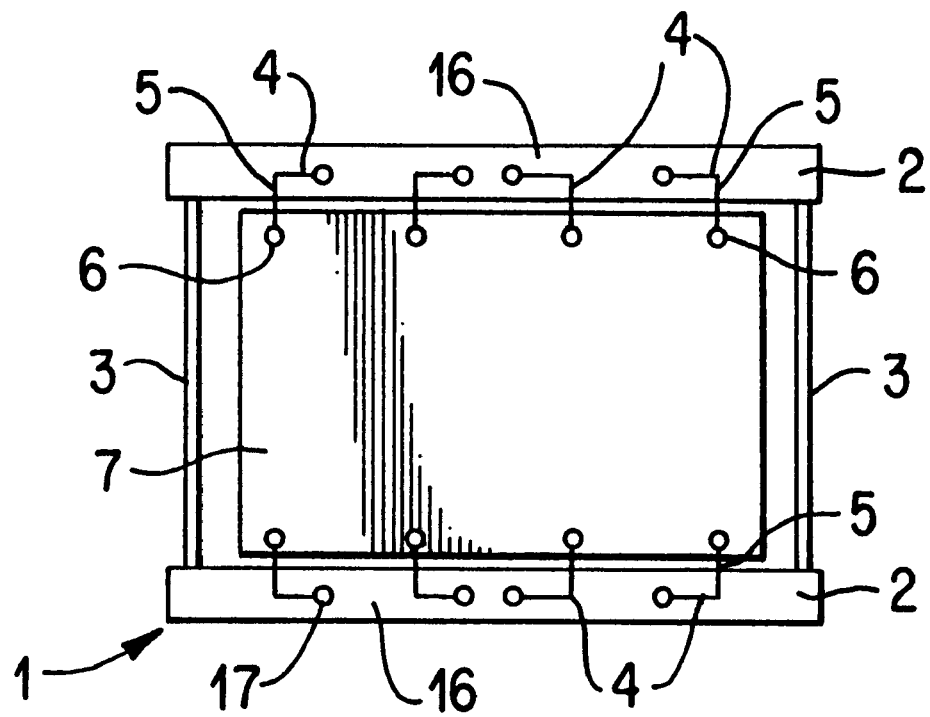
FIG. 1 is a diagrammatic plan view of a frame with a substrate mounted therein.

FIG. 1 is a plan view of a rectangular frame 1 that, in the embodiment shown, consists of two lateral frame members 2 and connecting rods 3 arranged between them. Attached to the lateral frame members 2 are tension springs 4 which are spaced at a predetermined distance from one another and have a spring portion 5 that projects inwards from the frame member 2, the free end of which spring portion 5 engages in an opening 6 at the edge of a thin, board-shaped substrate 7, for example a printed circuit board. The board 7 may be, for example, from 0.2 to 0.8 mm thick. The spring portions 5 exert upon the board 7 a tension in the horizontal direction in such a manner that the board does not sag.

The frame 1 can be clamped by the lateral frame members 2, for example, in longitudinal grooves of conveyor belts (not shown) and can be transported in that manner.

If frames 1, arranged in succession, having boards 7 mounted therein are being transported, for example, through a coating installation in which a coating is applied to the board by a pouring curtain falling from above, the pouring curtain is so shaped, by means of laterally arranged limit stops, that only that region of the board which is designed to be coated is coated and the transport frame 1 itself is not soiled. As a result of that delimitation of the pouring curtain, cleaning of the conveyor belts provided for transporting the frame 1 is not required because they are not soiled by the coating material.

Figure 2:
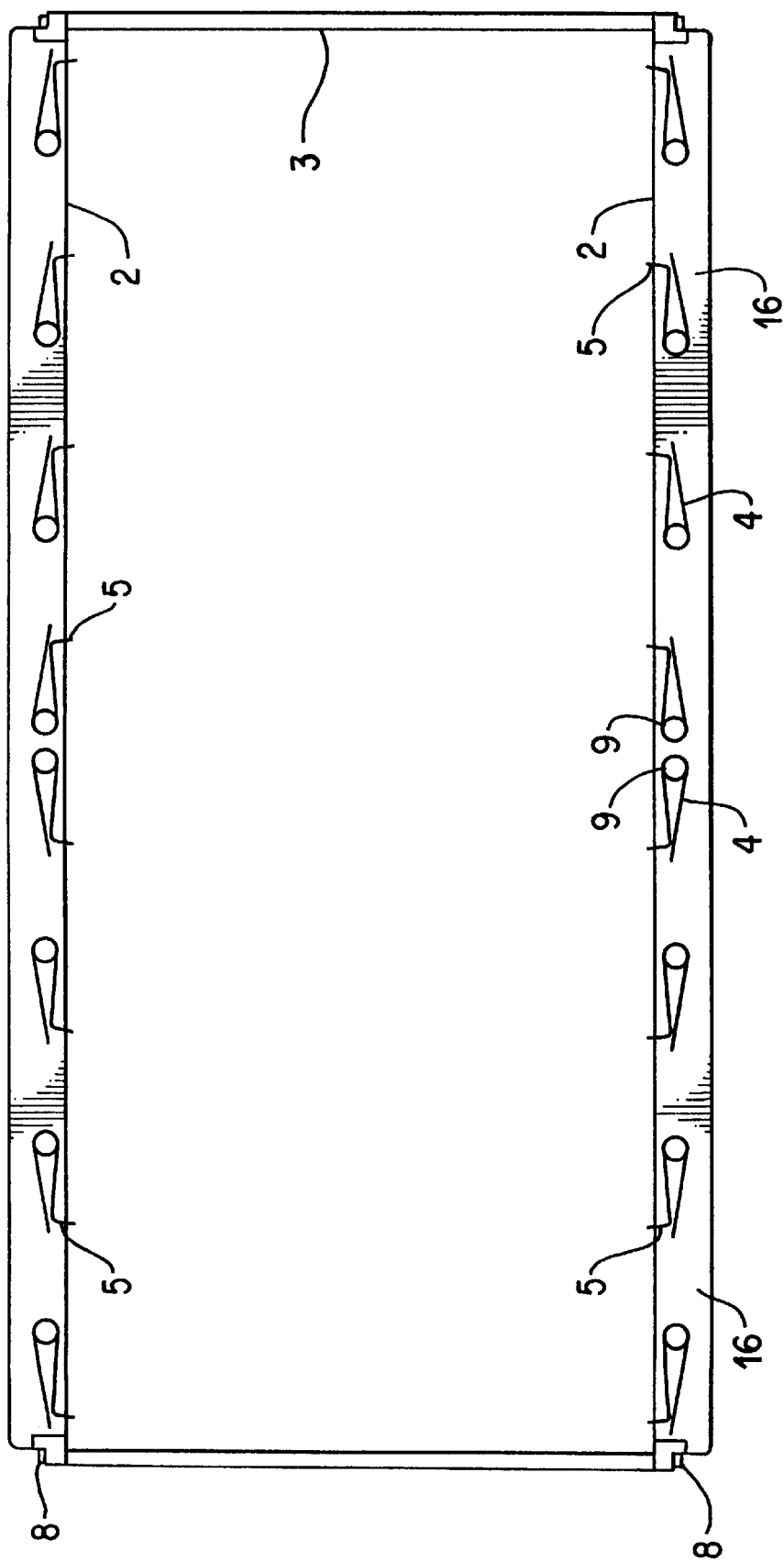
FIG. 2 is a plan view of a frame having tension springs.

FIG. 2 is a plan view of an embodiment, by way of example, of a transport frame 1 having tension springs 4 mounted therein. Formed or arranged at each end of the frame members 2 is a projection in which a screw 8 is inserted through a bore, which screw engages in a threaded bore in the connecting rod 3. A helically wound portion 9 of the tension springs 4 shown in detail in FIG. 3 is inserted into a bore 17 (FIG. 4) in the frame member 2, those bores being so arranged along the length of the frame member 2 that the inwardly projecting spring portions 5 are spaced from one another by substantially the same distance. In the embodiment shown, the two bores arranged in the centre of a frame member 2 are arranged closely adjacent to one another to receive the tension springs 4, the tension springs 4 being inserted in opposite directions to one another and arranged, on one side, in such a manner as to form a mirror image of the springs on the other side. The frame members 2 are provided on their outside with a free portion 16 which can be inserted into a longitudinal groove of a conveyor belt (not shown).

Instead of the free portion 16, there may be provided on the outside of the frame members 2 other devices which are suitable for attachment to a conveyor belt or similar conveying means. For example, on the outer edge there may be provided bores for hanging over pegs of a transport device or the like.

FIG. 3a is a plan view of a tension spring 4 in the relaxed state before mounting in an opening in the lower frame member 2 shown in FIG. 2. FIG. 3b is a view of the spring portion 5 in the longitudinal direction of the frame. FIG. 3c is a side view of the tension spring 4 from FIG. 3a above.

The tension spring 4 has two spring arms 10 and 11 that project in approximately the same direction from the helically wound portion 9 having, for example, only two turns, the free end of the spring arm 11 in FIG. 3a being bent perpendicular to the plane of the drawing. The bent end portion 12 of the spring arm 11 (shown in FIG. 3c) is inserted in a bore in the frame member 2, the spring arm 11, in the view in FIG. 3a, being rotated clockwise relative to the spring arm 10 and thereby tensioned, the wound portion 9 of the tension spring 4 being mounted in a bore in the frame member 2. As shown in FIG. 3c, the spring arm 10 is bent slightly relative to the longitudinal extent of the spring arm 11, for example by approximately 10°.

The spring portion 5 that projects from the frame member 2 is in the form of an end portion, bent by approximately 90°, of the spring arm 10, which end portion has, in the elevation according to FIG. 3b, a lower portion 13 that extends from the spring arm 10 and which is adjoined by a portion 14 that is, in the elevation, slightly angled, the free end portion 15 of which is angled relative to the portion 14 by approximately 110° and forms a tensioning hook.

In the plan view according to FIGS. 2 and 3a, the free end portion 15, or tensioning hook, of the spring portion 5 engages from below in an opening 6 at the edge of the thin printed circuit board 7, as shown in perspective view in FIG. 4. The spring arm 10 thus exerts a tensioning force outwards, viewed from the frame member 2, with the result that the printed circuit board 7 is held tautly between opposite tensioning hooks 15.

A printed circuit board 7 can be fitted in a frame 1 that is provided with tension springs manually or automatically; for example, in the plan view according to FIG. 2 the spring arms 10 are rotated inwards by way of a camming ramp, a printed circuit board 7 being placed from above onto the accordingly positioned tensioning hooks 15. Once the spring arms 10 have been released, the printed circuit board 7 is held tautly. The tensioning hook 15 engages the printed circuit board 7 through the opening 6 in such a manner that when the frame is turned through 180° the printed circuit board 7 continues to be held tautly, being unable to free itself downwards from the tensioning hooks 15 that now engage through the opening 6 from top to bottom. The edge of the opening 6 is engaged by the tensioning hook 15 from behind.

In that manner, printed circuit boards 7 are held resiliently on both sides, independently of different temperature effects occurring during their processing, and can be coated or processed from both sides.

Figure 4:
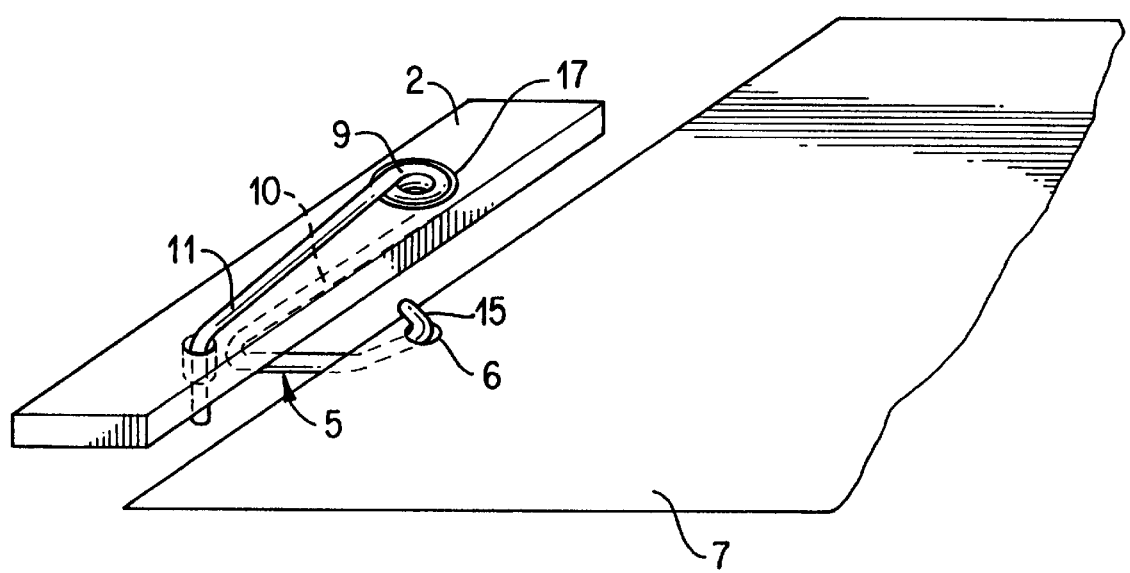
FIG. 4 is a perspective view of a tension spring mounted in the frame, and a substrate.
Figure 5:
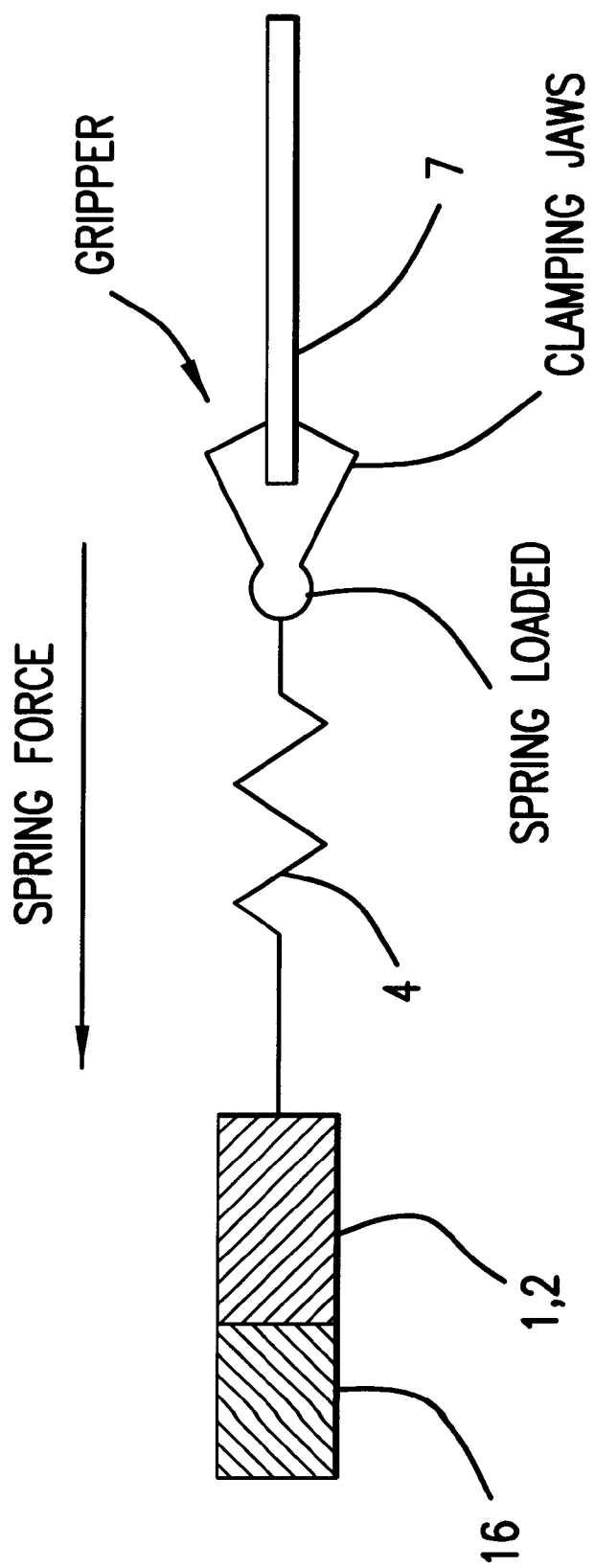
FIG. 5 is a view of an alternative embodiment of the present invention having spring loaded clamps.

According to the embodiment shown in FIG. 4, the tension spring 4 is mounted in the frame member 2 in such a manner that the spring arm 11 rests against the upper side of the frame member whilst the spring arm 10 rests against the underside of the frame member. It is also possible so to mount the tension spring 4 on the frame member 2 that both spring arms 10 and 11 rest against the upper side of the frame member 2. In that arrangement, it is expedient to provide fixing means on the wound portion 9 of the tension spring 4 so that the tension spring 4 cannot work loose from the frame.

Various modifications of the described embodiment are possible. For example, the tension spring 4 may be of different construction from that shown in FIG. 3. For example, a tension spring 4 may be so constructed that it has spring arms that project away from one another at an angle of 90°, one of which arms serves to attach the spring to the frame and the other to tension the printed circuit board 7. The openings 6 along the edge of a printed circuit board 7 may also be of different shape, being adapted to the shape of the tensioning hook.

In a practical embodiment, the openings 6 may be 5 mm in diameter with a spacing of 5 mm from the edge of the printed circuit board.

The spring arms 10 and 11 may lie in recesses in the flat frame members 2 so that they do not project above the surface of the frame members 2, thus forming a smooth bearing surface when the frame is conveyed, for example, on transport rollers or the like. In that case, the spring arm 10 lies in a relatively broad recess in the frame member 2 so that it is possible for the spring arm 10 to rotate in the recess in the plane of the flat frame member 2.

In a practical embodiment, during transport the frames may be taken over by transport rollers of, for example, the pouring transport device, it being possible for elements to be placed against the sides of the frames by means of which the frames are centred on the transport path relative to the delimitation of the pouring film. In that case, it is sufficient for the, for example, bar-shaped elements that serve as centring device to be placed at the sides of the frames.

According to another embodiment of the invention, stretching elements in the form of grippers may be attached to the frame members 2, lying opposite one another, of a rigid transport frame 1, which stretching elements clamp the edge of a substrate and are acted upon by a spring towards the frame member 2 so that those grippers tension the substrate in the plane of the frame. The grippers themselves may be provided with spring-loaded clamping jaws which can be opened automatically by way of camming ramps. In that embodiment, the thickness of the frame members 2 transverse to the plane of the frame is such that the grippers do not project above the bearing surfaces of the frame members 2. Depending on the size of the substrate, a plurality of grippers may be provided as stretching or tensioning elements along the length of the frame members.

The distance of the two frame members 2 one from another may also be adjustable, for example by a screw connection to the connecting rods 3, for the purpose of adaptation to various breadths of substrate.

The described transport apparatus having a rigid frame and tensioning elements arranged thereon which engage the edge of the substrate and tension the substrate is suitable especially for a method of applying solder masks or similar materials to thin printed circuit boards that may be from 0.05 to 0.5 mm thick.

What is claimed is:

1. Transport apparatus for thin, board-shaped substrates (7), especially printed circuit boards, having a frame (1) for holding a substrate (7), tension springs (4) being arranged spaced from one another on the frame members (2), lying opposite one another, of the frame (1), which tension springs have a tensioning hook (15) which engages in an opening (6) at the edge of the substrate having said openings (6), the frame (1) being provided with a device (16) that serves to provide connection to a conveyor belt or the like, wherein said tension springs (4) exert a tension away from the substrate (7) in the direction of the plane of the thin substrate to avoid sagging of the substrate.

2. Transport apparatus according to claim 1, wherein the tension spring (4) has a spring portion (5) that projects inwards from the frame approximately at a right angle, on which spring portion (5) there is formed a tensioning hook (15) that projects perpendicular to the plane of the frame and engages in the opening (6) in the substrate (7).

3. Transport apparatus according to claim 1, wherein a tension spring (4) has two spring arms (10, 11) that project from a helically wound central portion (9), one of which arms serves to bear against the frame and the other serves to receive the substrate, the central portion (9) being mounted in an opening in the frame having said openings.

4. Transport apparatus according to claim 3, wherein the spring arms (10, 11) are arranged in recesses in the frame members (2) having said recesses in order to provide the frame members (2) with a continuously smooth bearing surface.

5. Transport apparatus according to claim 3, wherein the spring arms are arranged in recesses in the frame members having said recesses in order to provide the frame members with a continuously smooth bearing surface.

6. Transport apparatus according to claim 3, wherein the tension spring has a spring portion that projects inwards from the frame approximately at a right angle, on which spring portion there is formed a tensioning hook that projects perpendicular to the plane of the frame and engages in the opening in the substrate.

7. Transport apparatus according to claim 6, wherein the spring arms are arranged in recesses in the frame members having said recesses in order to provide the frame members with a continuously smooth bearing surface.

8. Transport apparatus for thin, board-shaped substrates (7), especially printed circuit boards, having a frame (1) for holding a substrate (7), tensioning elements being arranged spaced from one another on the frame members (2), lying opposite one another, of the frame (1), which tensioning elements have clamping jaws for grasping the edge of the substrate, the tensioning elements being acted upon by spring force towards the frame members (2), wherein said tension springs (4) exert a tension away from the substrate (7) in the direction of the plane of the thin substrate to avoid sagging of the substrate, and the frame (1) being provided with a device (16) which serves to provide connection to a conveyor belt or similar transport means.

* * * * *